(12) United States Patent
Moore et al.

(10) Patent No.: US 9,714,462 B2
(45) Date of Patent: Jul. 25, 2017

(54) VACUUM PRE-WETTING APPARATUS AND METHODS

(71) Applicant: APPLIED Materials, Inc., Santa Clara, CA (US)

(72) Inventors: Robert B. Moore, Bigfork, MT (US); Vincent Steffan Francischetti, Columbia Falls, MT (US)

(73) Assignee: APPLIED Materials, Inc., Santa Clara, CA (US)

( * ) Notice: Subject to any disclaimer, the term of this patent is extended or adjusted under 35 U.S.C. 154(b) by 197 days.

(21) Appl. No.: 14/509,784

(22) Filed: Oct. 8, 2014

(65) Prior Publication Data

US 2016/0102397 A1    Apr. 14, 2016

(51) Int. Cl.
| | |
|---|---|
| *C23C 16/00* | (2006.01) |
| *C23C 16/02* | (2006.01) |
| *C23C 16/44* | (2006.01) |
| *C23C 18/16* | (2006.01) |
| *C25D 5/34* | (2006.01) |
| *C25D 17/00* | (2006.01) |
| *C25D 17/06* | (2006.01) |
| *C23C 18/18* | (2006.01) |

(52) U.S. Cl.
CPC .......... *C23C 16/0227* (2013.01); *C23C 16/44* (2013.01); *C23C 18/163* (2013.01); *C23C 18/1619* (2013.01); *C23C 18/1803* (2013.01); *C23C 18/1851* (2013.01); *C25D 5/34* (2013.01); *C25D 17/001* (2013.01); *C25D 17/06* (2013.01)

(58) Field of Classification Search
None
See application file for complete search history.

(56) References Cited

U.S. PATENT DOCUMENTS

| | | |
|---|---|---|
| 5,368,634 A | 11/1994 | Hackett |
| 6,544,585 B1 | 4/2003 | Kuriyama et al. |
| 6,551,487 B1 | 4/2003 | Reid et al. |
| 6,800,187 B1 | 10/2004 | Reid et al. |
| 7,060,624 B2 | 6/2006 | Andricacos et al. |
| 8,425,687 B2 | 4/2013 | Keigler |
| 8,962,085 B2 | 2/2015 | Mayer et al. |
| 2010/0212694 A1 | 8/2010 | Keigler |
| 2010/0320081 A1 | 12/2010 | Mayer et al. |
| 2010/0320609 A1 | 12/2010 | Mayer et al. |
| 2012/0052204 A1* | 3/2012 | Puch ................ H01L 21/67057 427/255.23 |

* cited by examiner

*Primary Examiner* — Michael Barr
*Assistant Examiner* — Jason Riggleman
(74) *Attorney, Agent, or Firm* — Kenneth H. Ohriner; Perkins Coie LLP

(57) ABSTRACT

A processing apparatus may include a down-facing substrate processing chamber fixed at acute angle to horizontal. A chuck plate on a platform may pivot from an open position wherein the platform is at an acute angle to the processing chamber, to a parallel position wherein the platform is parallel to the processing chamber. The chuck plate may then be moved linearly into sealing engagement with the processing chamber. A chuck holder may be provided on the platform to hold the chuck in place.

16 Claims, 11 Drawing Sheets

VACUUM PRE-WETTING APPARATUS AND METHODS

BACKGROUND OF THE INVENTION

Semiconductor and similar micro-scale devices are typically manufactured on a substrate or wafer. Metal or other conductive material is plated onto features of the wafer, such as trenches and vias, to form electrical components and connections. Vacuum pre-wet is a pre-plating step used to increase plating quality, especially with features having high aspect ratios. Pre-wetting works by removing gas from the features, and filling the features with a pre-plating solution. The pre-plating solution is typically de-ionized (DI) water, with or without dilute compounds such as surfactants or acids.

By fully wetting features before the wafer enters the plating solution, metal ions in the plating solution can better diffuse into the water and fully fill the feature when plating begins. A common failure of un-wetted features is that the metal ions in the plating solution cannot reach the bottom of the feature due to a bubble of gas trapped in the feature. The trapped gas bubble tends to cause the plated metal to pinch off, leaving a void at the bottom of the feature, which results in a defect, such as an unconnected circuit line.

In a new generation of wafer electroplating machines, a wafer is clamped in a plating chuck upon entry into the machine, as described in U.S. Pat. No. 9,399,827 B2. The wafer remains in the chuck during most or all process steps within the machine, presenting engineering challenges in pre-wetting the chucked wafer. Accordingly, new pre-wetting methods and apparatus are needed.

SUMMARY OF THE INVENTION

A processing apparatus may include a substrate processing chamber fixed at acute angle to horizontal. The processing chamber may have a down-facing opening. A chuck plate on a platform may pivot from an open horizontal position wherein the platform is at an acute angle to the processing chamber, to a parallel position wherein the platform is parallel to the processing chamber. The chuck plate may then be moved up linearly into sealing engagement with the processing chamber. A chuck holder may be provided on the platform to hold the chuck in place.

A method for pre-wetting a wafer in a chuck may include securing the chuck onto a horizontal chuck plate, and then pivoting the chuck plate into a parallel position wherein the chuck is parallel to a substrate processing chamber oriented at an acute angle. The chuck plate may then be moved linearly into engagement with the substrate processing chamber to form a seal between the chuck plate and the substrate processing chamber.

Pressure in the substrate processing chamber is reduced to vacuum conditions, optionally to a pressure just sufficient to avoid boiling, up to about one half of atmospheric pressure. De-gasified and de-ionized water may be introduced into the chamber from a lower end of the chamber, until the wafer is covered with water, while maintaining the chamber under vacuum. The chamber may then be vented to ambient pressure and the water drained out of the chamber. The chamber may be at an acute angle to horizontal, with water quiescently filling the chamber via gravity flow.

BRIEF DESCRIPTION OF THE DRAWINGS

In the drawings, the same element number indicates the same element in each of the views.

DETAILED DESCRIPTION OF THE DRAWINGS

Processing a wafer within a chuck provides various advantages. However, initially moving a wafer into a chuck requires a small but not insignificant amount of time. On the other hand, the time interval between the end of the pre-wetting process, and the start of the plating process, is preferably minimized to prevent features on the wafer from de-wetting. The present apparatus and methods may provide the benefits of both processing a wafer within a chuck while also reliably achieving pre-wetting performance.

Figure 1:
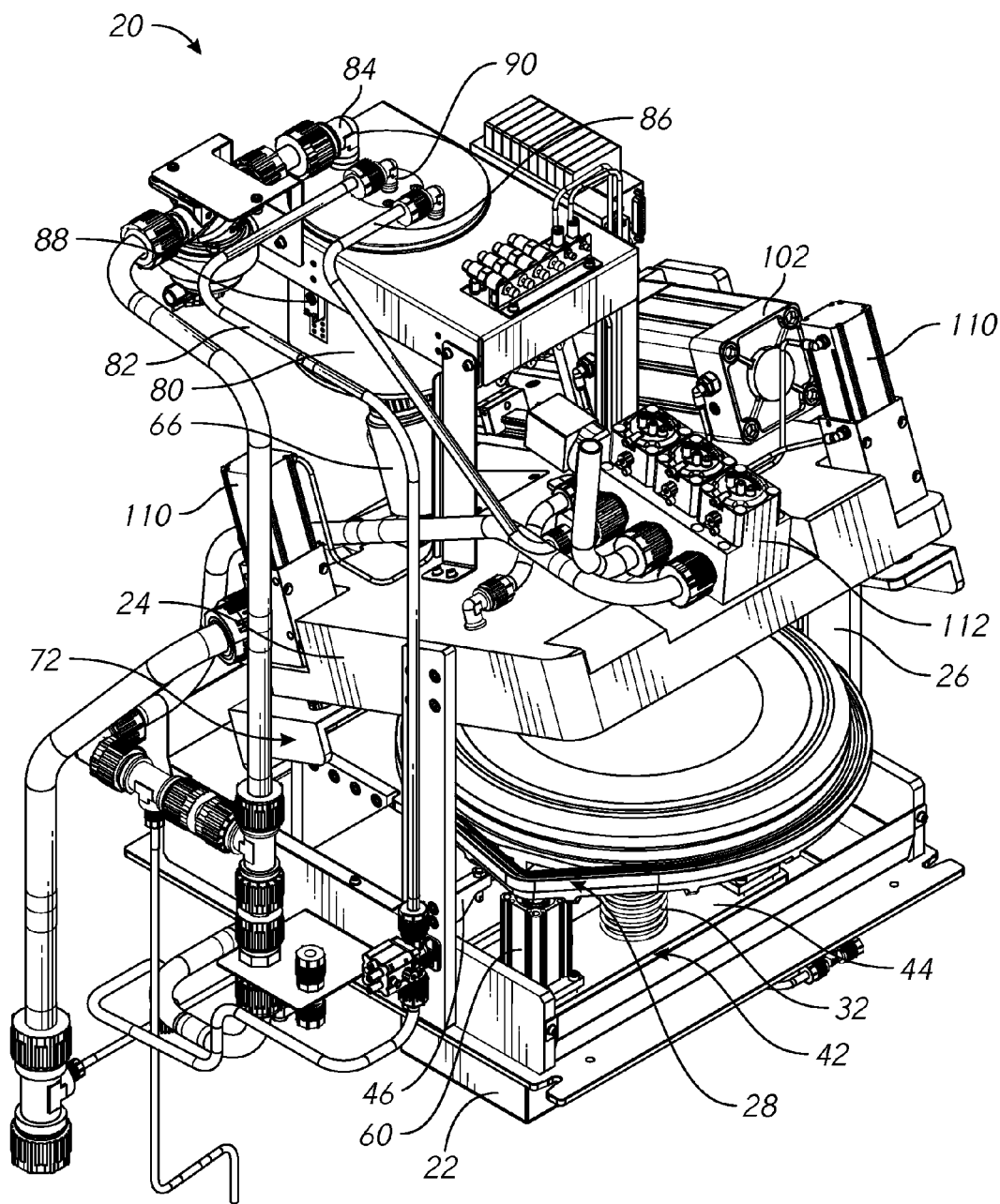
FIG. 1 is a front and left side perspective view of a vacuum pre-wet apparatus or tool for use in pre-wetting a chucked wafer.
Figure 2:
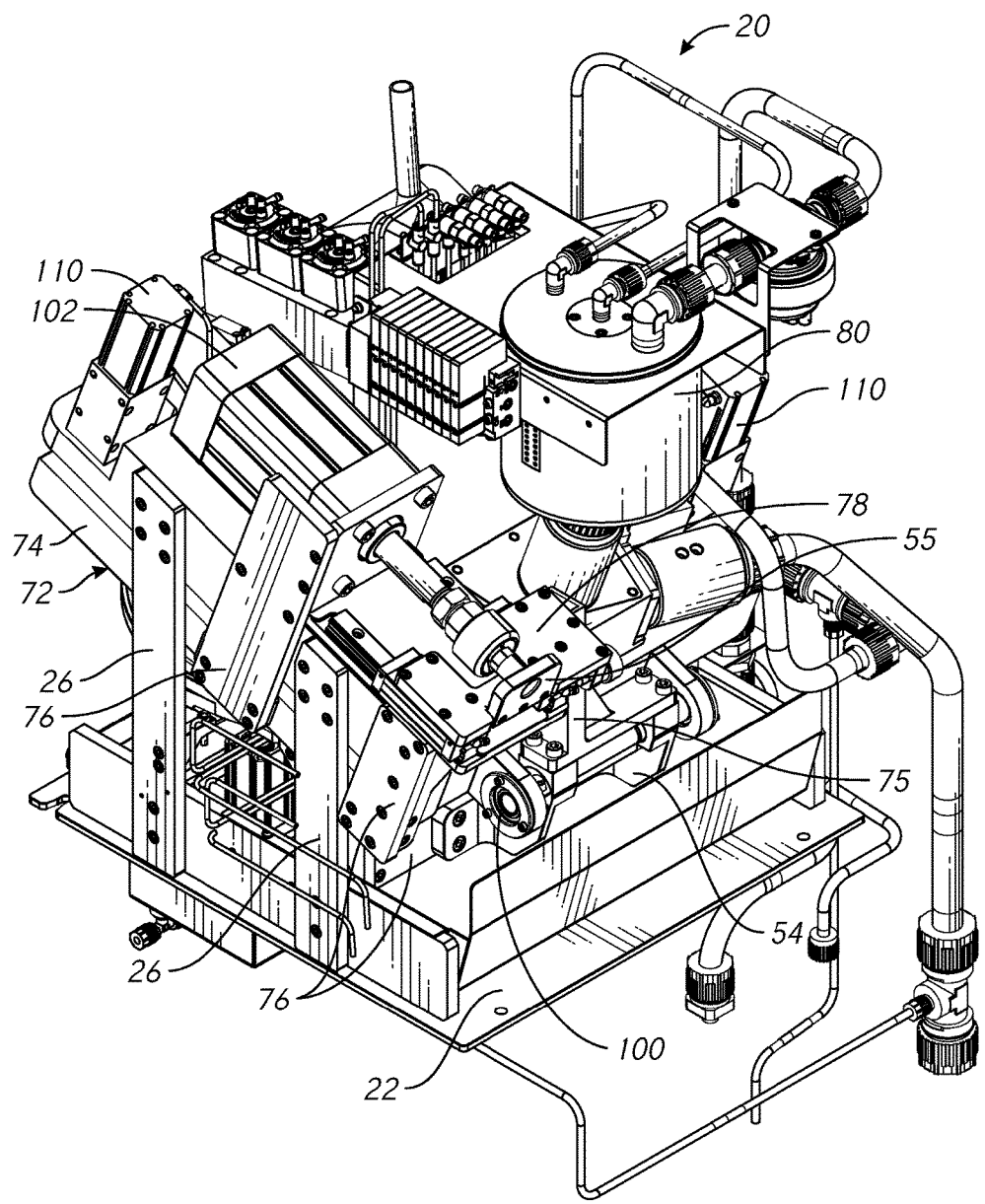
FIG. 2 is a back and right side view of the tool shown in FIG. 1.
Figure 3:
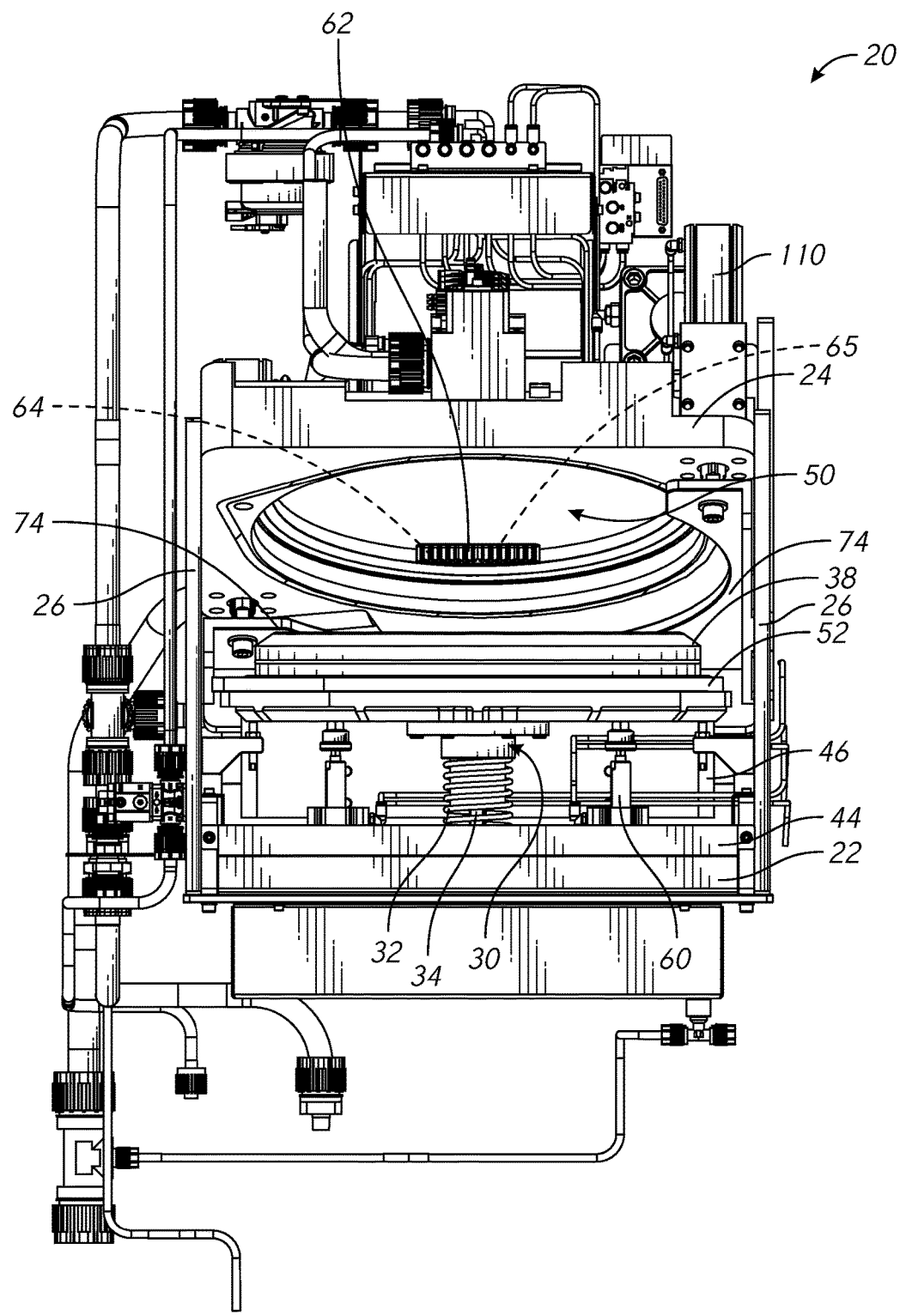
FIG. 3 is a front view of the tool shown in FIGS. 1 and 2.

As shown in FIGS. 1-4, a vacuum pre-wet apparatus or tool 20 has a chamber plate 24 supported by side posts 26 on a base 22. The base 22 generally may be a fixed horizontal structure such as a deck of a processing system, such as the system 140 shown in FIG. 12. As shown in FIG. 3, a down facing processing chamber 50 is formed in the underside of the chamber plate 24. The chamber 50 or the chamber plate 24 is fixed in place relative to the base 22 and oriented at an acute angle AA to horizontal. Angle AA may typically range from 10 to 30 or 15 to 25 degrees.

Referring to FIGS. 1-5, a platform assembly 28 includes a chuck plate 52 for receiving a chuck 38 holding a wafer 40. A hinge 100 pivotally attaches the platform assembly 28 to a lift frame generally indicated as 72. The lift frame 72 may include a lift ring 74 formed of L-shaped members attached to lift side plates 76 attached to a lift plate 78 above the chamber plate 24. A pivot actuator 102 on the lift plate 78 pushes or pulls on a roller 57 in rolling engagement with a lever 55 rigidly connected to the chuck plate 52 via an angle bracket 54.

Figure 7:
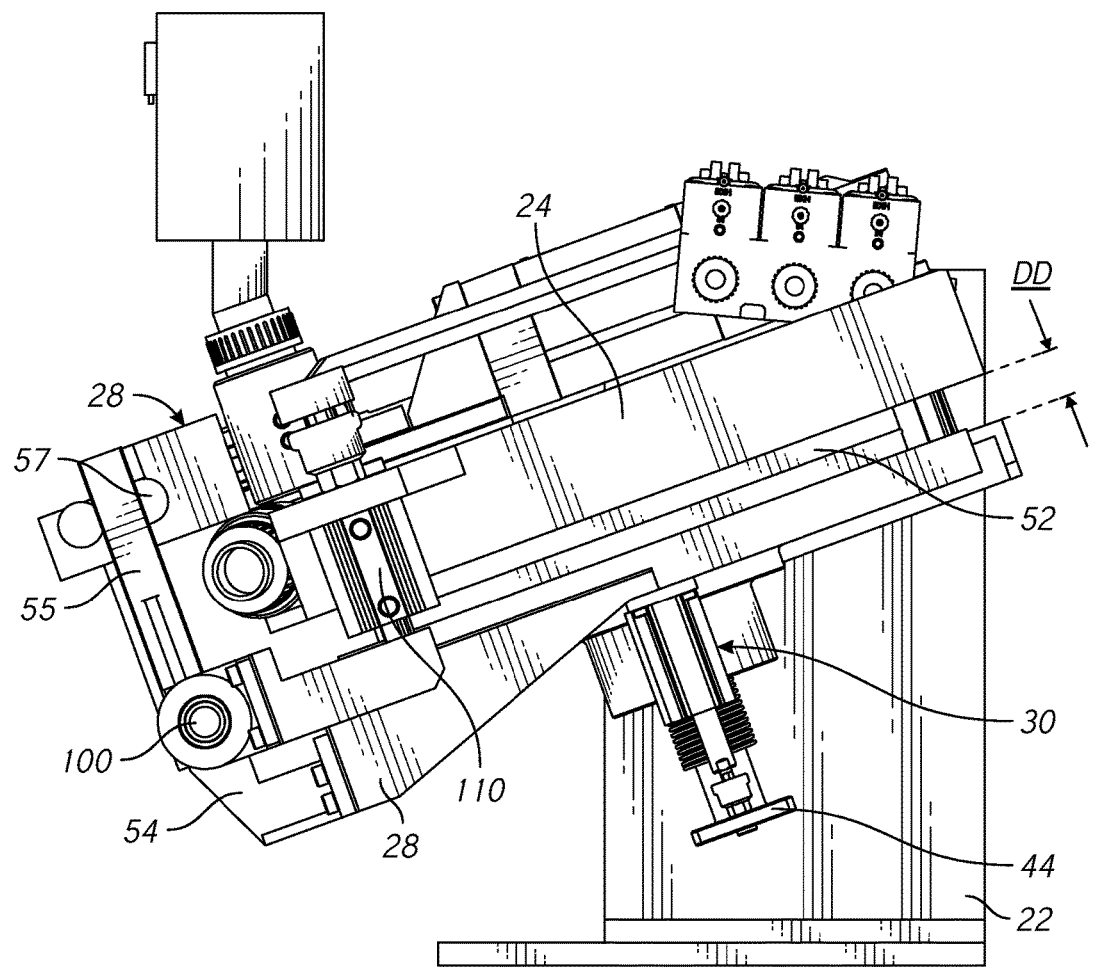
FIG. 7 is a left side view of the tool with the platform in the parallel position.

Operation of the pivot actuator 102 pivots the platform assembly 28 from the open or chuck handoff position shown in FIGS. 1-4, to the parallel position shown in FIG. 7, where the chuck plate 52 is parallel to the disk-shaped processing chamber 50 in the chamber plate 24. From the parallel position, the lift frame 72 is linearly moveable towards into sealing engagement with the chamber plate 24 via the lift actuators 110, for pre-wetting a wafer 40 held in the chuck 38.

Figure 5:
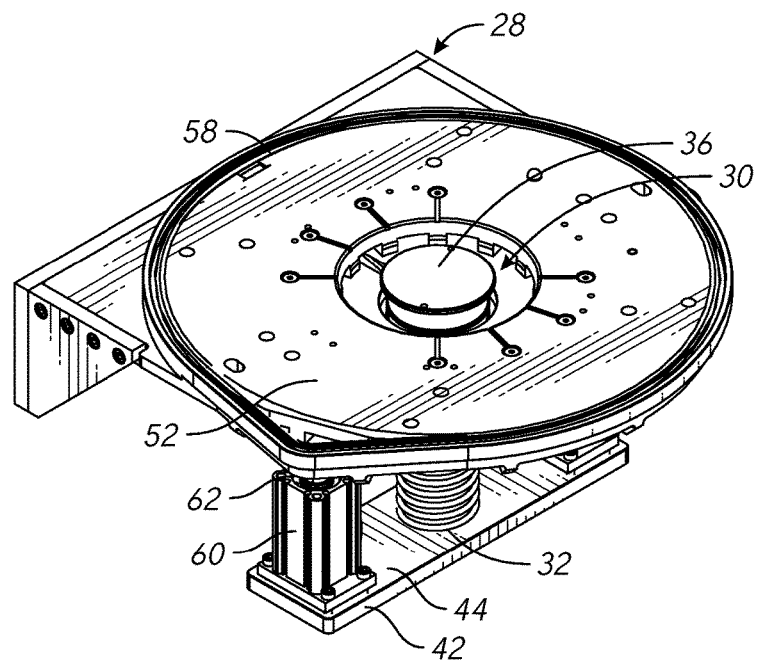
FIG. 5 is a perspective view of the platform shown in FIGS. 1-3.
Figure 6:
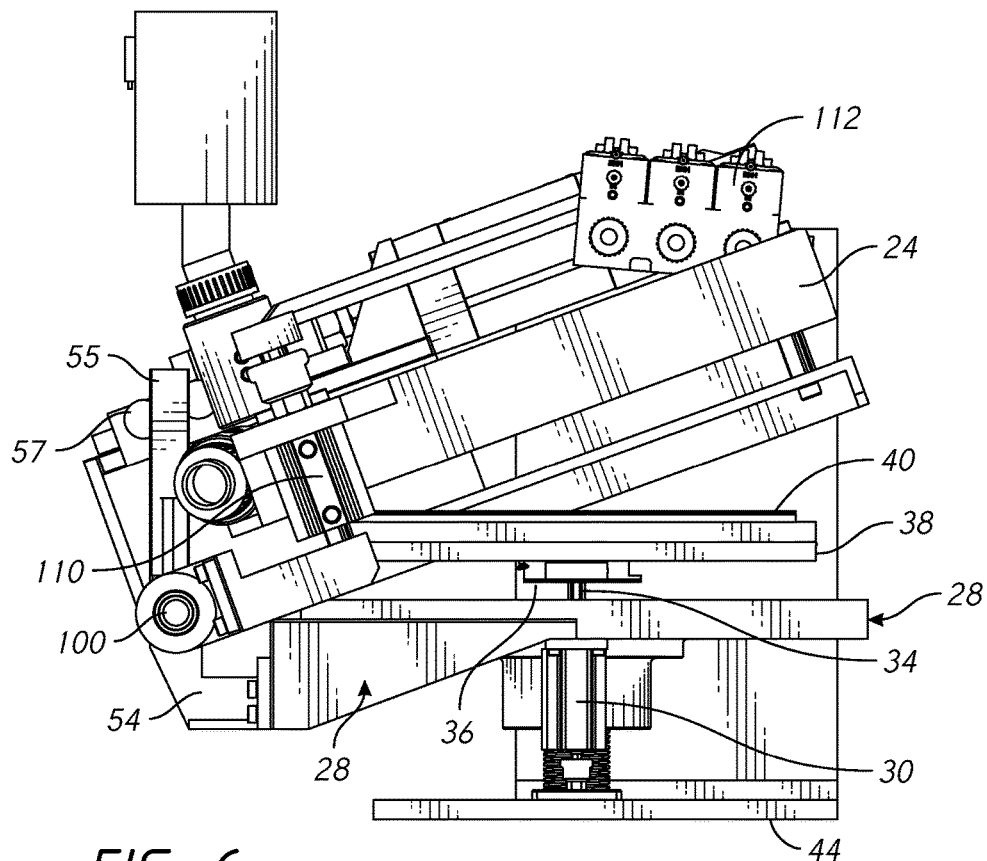
FIG. 6 is a left side view of the tool in a chuck load/unload position and the platform in an open position.

In FIGS. 3 and 5, a chuck holder generally shown at 30 is centrally located on the chuck plate 52 on the platform 28 assembly. The chuck holder 30 may include a chuck fitting 36 on a shaft 34. A spring 32 acts to pull the chuck fitting 36 down. Chuck actuators 60, shown in FIG. 8, are operable to lift the chuck fitting 36 up above the plane of the chuck plate 52, as shown in FIG. 6, to allow a chuck 38 holding a wafer 40 to be loaded into or removed from the tool 20.

Figure 8:
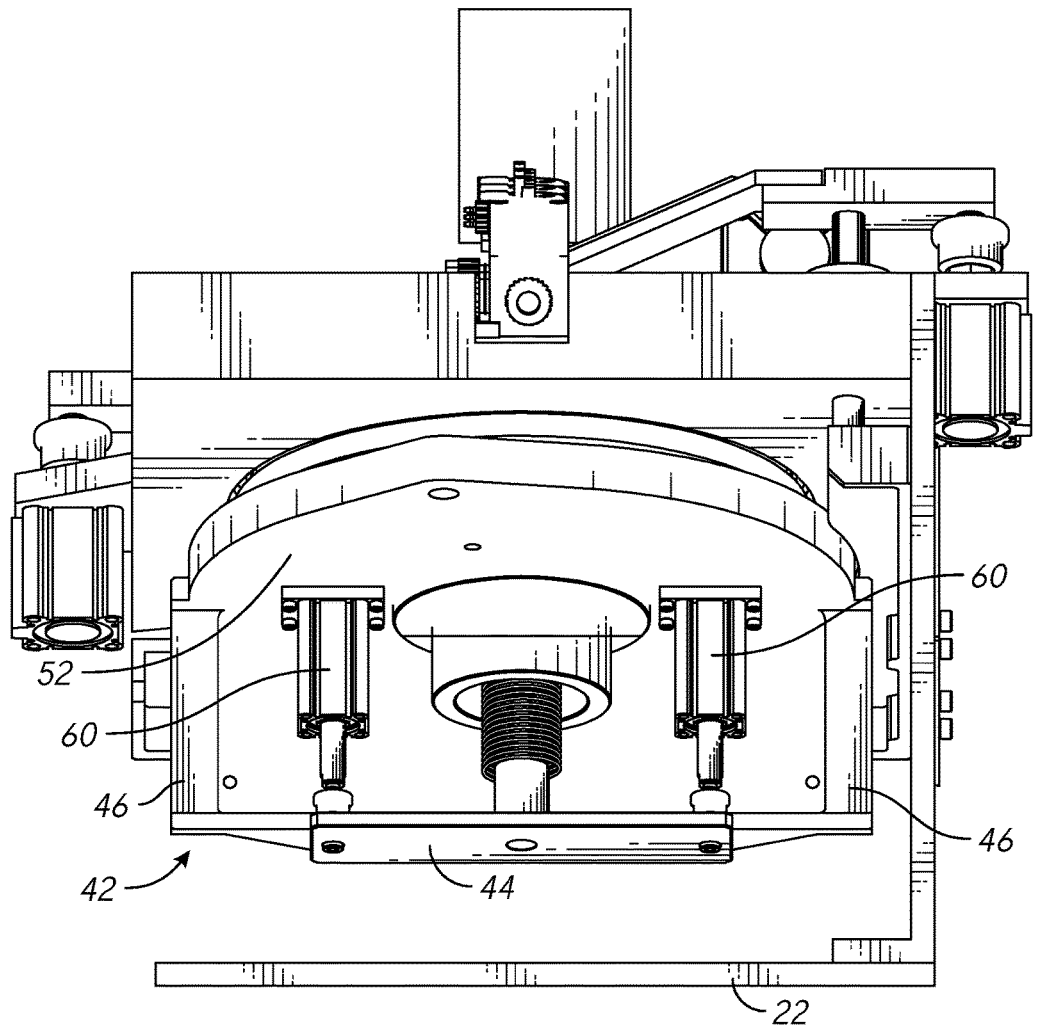
FIG. 8 is a front view of the tool as shown in FIG. 7.

As best shown in FIG. 8, a spring frame 42 is attached onto the bottom surface of the chuck plate 52 with side arms 46 on opposite ends of a cross plate 44. Linear chuck actuators 60 are positioned at opposites sides of the cross plate 44, with the piston or lower end of each actuator 60 attached to the cross plate 44 and the upper end of each actuator 60 attached to the bottom surface of the chuck plate 52. The lower end of the shaft 34 is attached to the cross plate 44, with the shaft 34 extending up through a clearance opening in the chuck plate 44.

The spring 32 around the shaft 34 pushes the cross plate 44 down and away from the chuck plate 44, which pulls the chuck fitting 36 down. The chuck 38 is securely held down onto the chuck plate 44 via operation of the actuators 60, as well as via the spring 32. To release the chuck 38 for chuck loading/unloading, the actuators 60 are reversed to lift the chuck 38 up off of the chuck plate 44, as shown in FIG. 6, to allow the chuck to be picked up by a robot.

Figure 11:
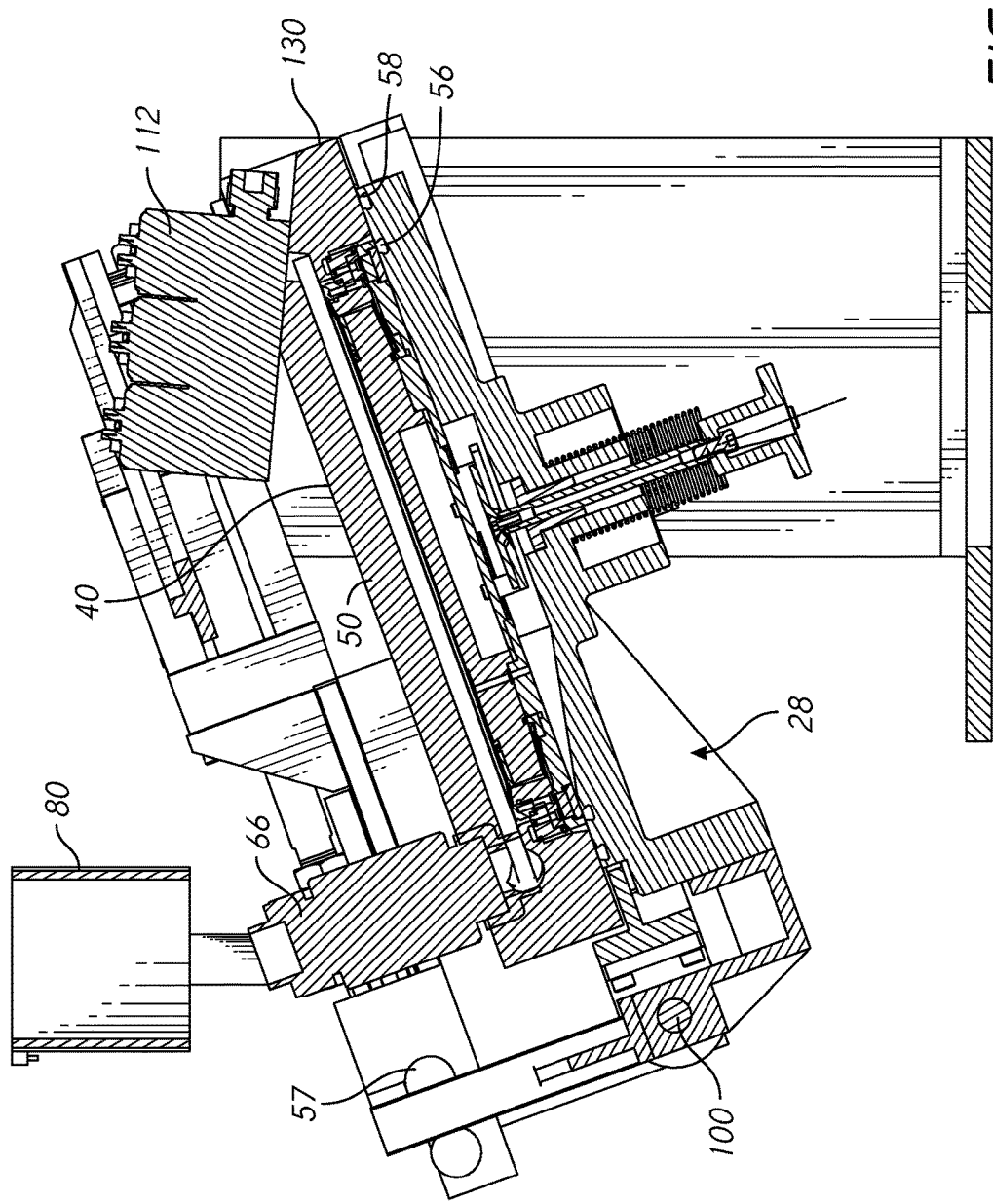
FIG. 11 is a section view of the tool as shown in FIG. 7.

Referring momentarily to FIGS. 5 and 11, an outer seal 58 on the chuck plate 52 is positioned to seal the chuck plate 52 against the chamber plate 24. An optional inner seal 56 is positioned to seal interior areas of the chuck from the processing chamber 50. As shown in FIG. 3, the chamber 50 may be formed as a disk-shaped opening in the bottom surface of the chamber plate 24. A liquid inlet 64 and a liquid drain 65 indicated with dotted lines in FIG. 3 are positioned behind a flow diffuser 62 which helps to provide a smooth quiescent flow of water into the chamber 50. The valve block 112 provides vacuum and pressure equalization ports into the chamber 50, at or near the highest point of the chamber.

As shown in FIGS. 1 and 2, a water degasification tank 80 is supported on top of the chamber plate 24. A water supply line 82 connects to a spray nozzle 90 inside of the tank 80. A vacuum port 84 on the tank 80 connects to a vacuum source. A pressure equalization line 86 connects to the equalization port 70 in the process chamber 50, so that the pressure in the tank 80 remains equal to the pressure in the process chamber 50. The lower end of the tank 80 is connected to the chamber liquid inlet 64 through a valve 66. A level sensor 88 may be provided to measure the liquid level within the tank 80. A valve block 112 controls vacuum in the chamber.

Figure 12:
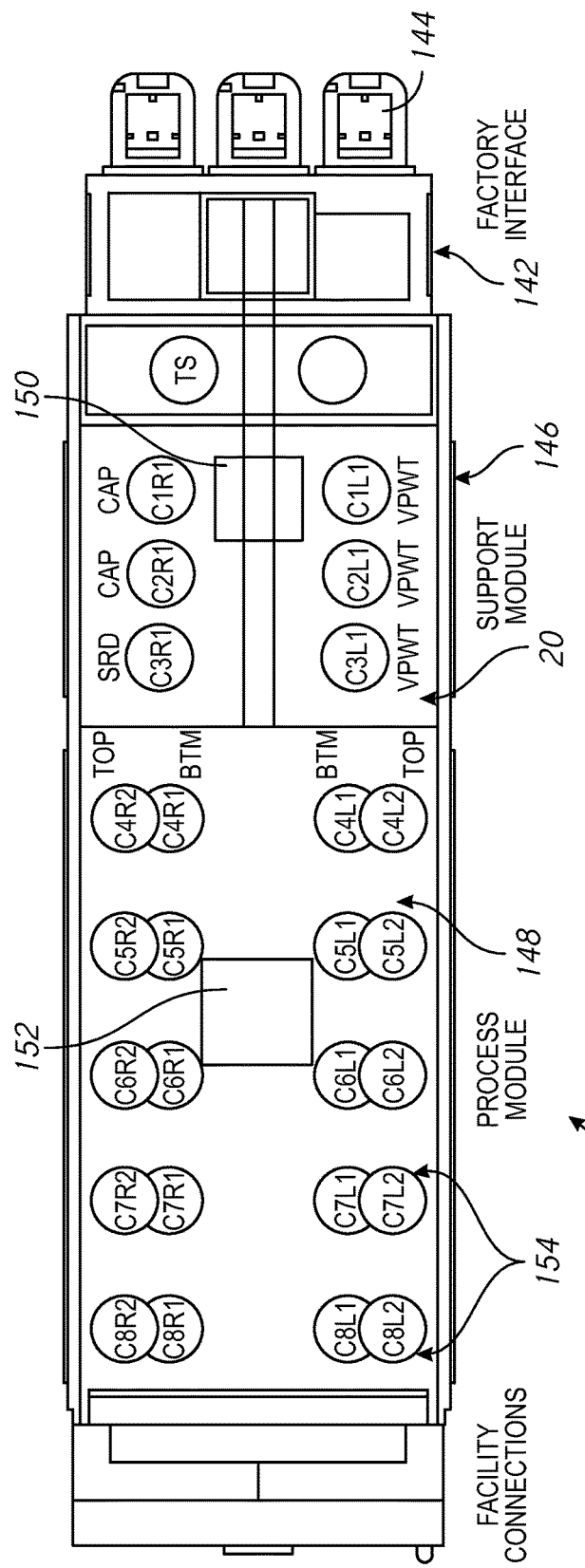
FIG. 12 is a schematic plan view of a processing system including the pre-wet tool shown in FIGS. 1-11.

FIG. 12 shows an example of the vacuum pre-wet apparatus 20 as used in a wafer processing system 140. The system 140 may include a factory interface 142 where containers of wafers 144 are docked and opened, for loading unprocessed wafers into the system 140 and removing processes wafers from the system. Typically a support robot 150 may move a wafer from the factory interface 142 into a support module 146 where the wafer is placed into a chuck 38. The chuck 38 is then moved into the pre-wet apparatus and undergoes a pre-wetting process. The pre-wetted wafer is then moved into a plating chamber 154 via a process robot 152.

Figure 4:
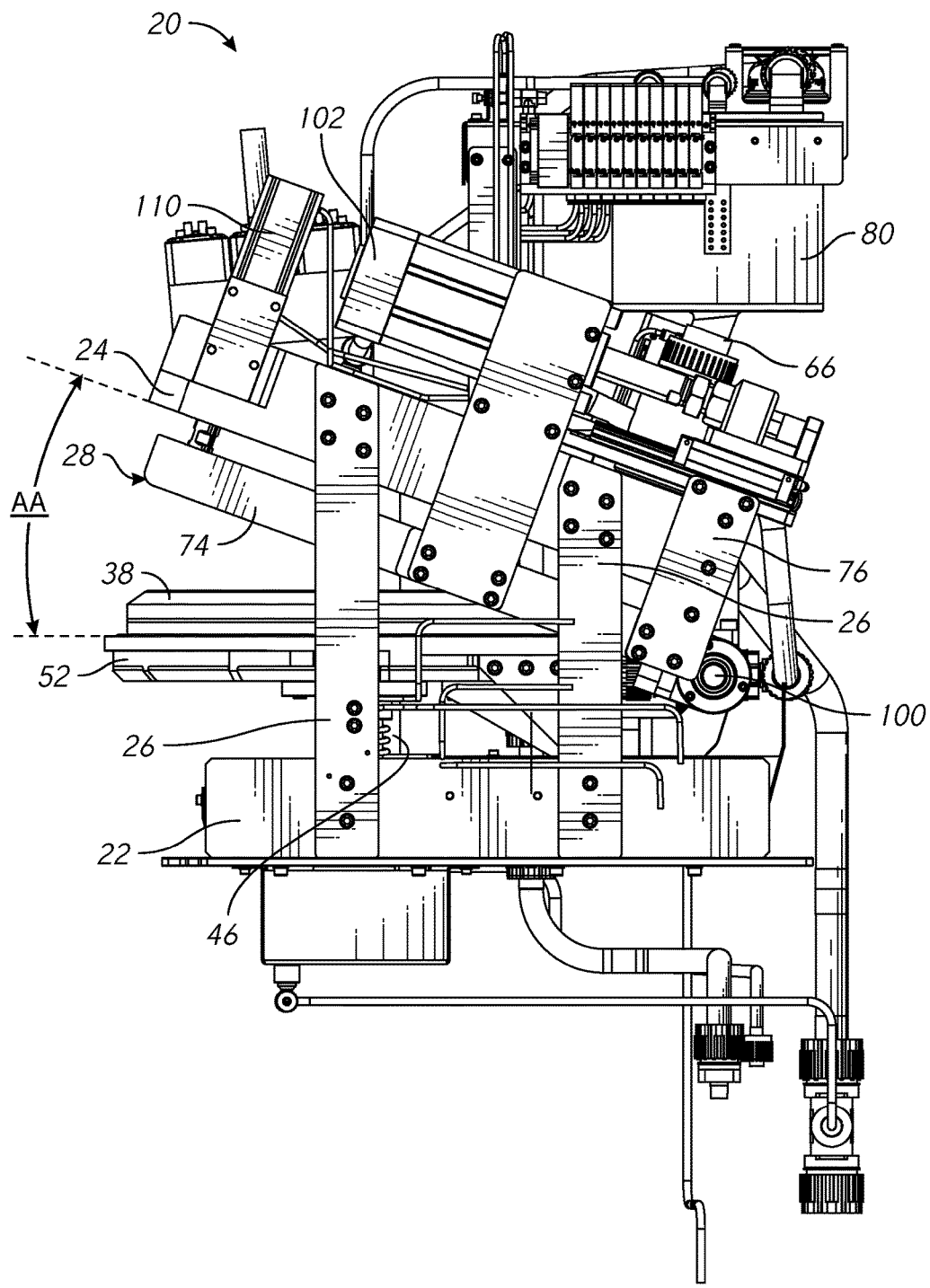
FIG. 4 is a right side view of the tool shown in FIGS. 1 and 2.

In one example of operation of the pre-wet apparatus 20, the robot 150 moves the chuck 38 carrying or enclosing the wafer into position above the chuck plate 52. The chuck fitting 36 is in the up position shown in FIG. 6. The chuck fitting 36 engages a complimentary fitting on the chuck which allows the chuck holder 30 to securely engage the chuck. The actuators 60 are reversed pulling the chuck 38 down onto the chuck plate 52, as shown in FIGS. 3 and 4.

Figure 9:
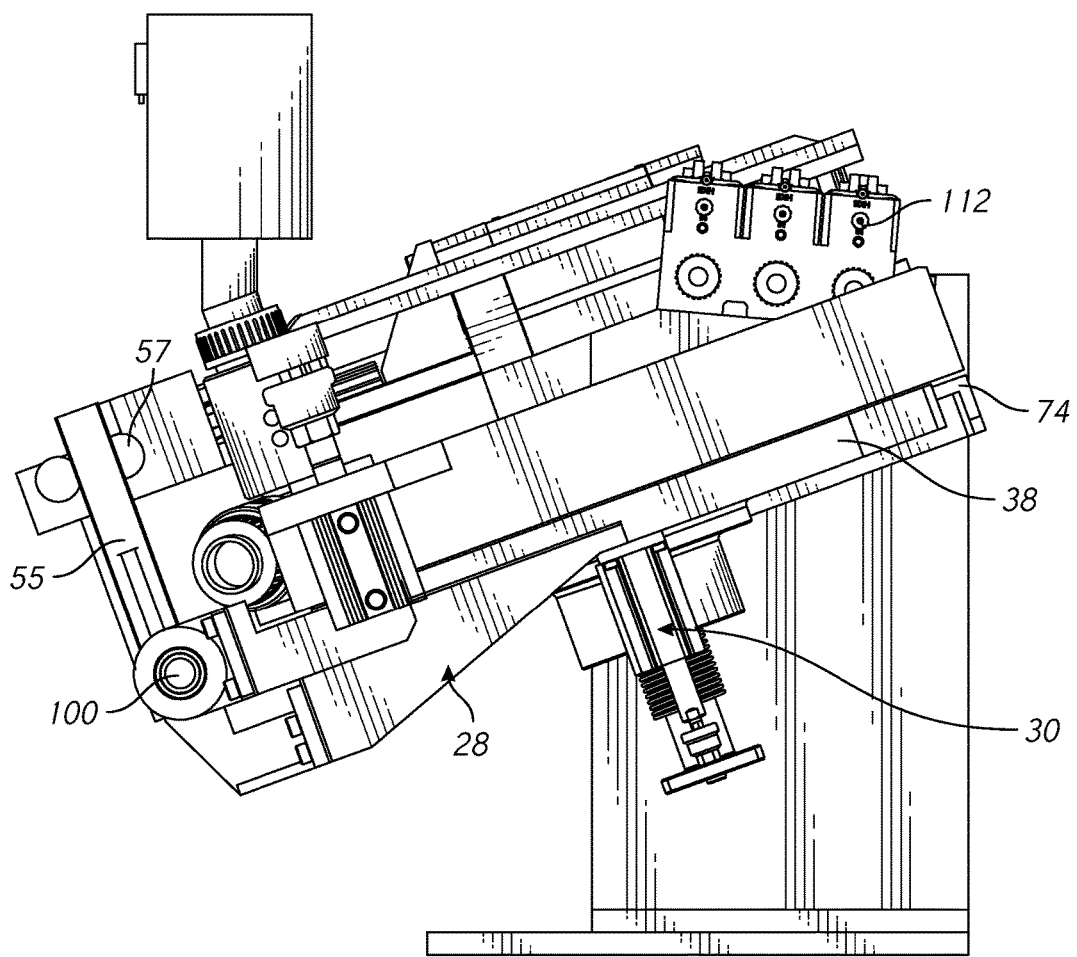
FIG. 9 is a left side view with the tool in a process position.
Figure 10:
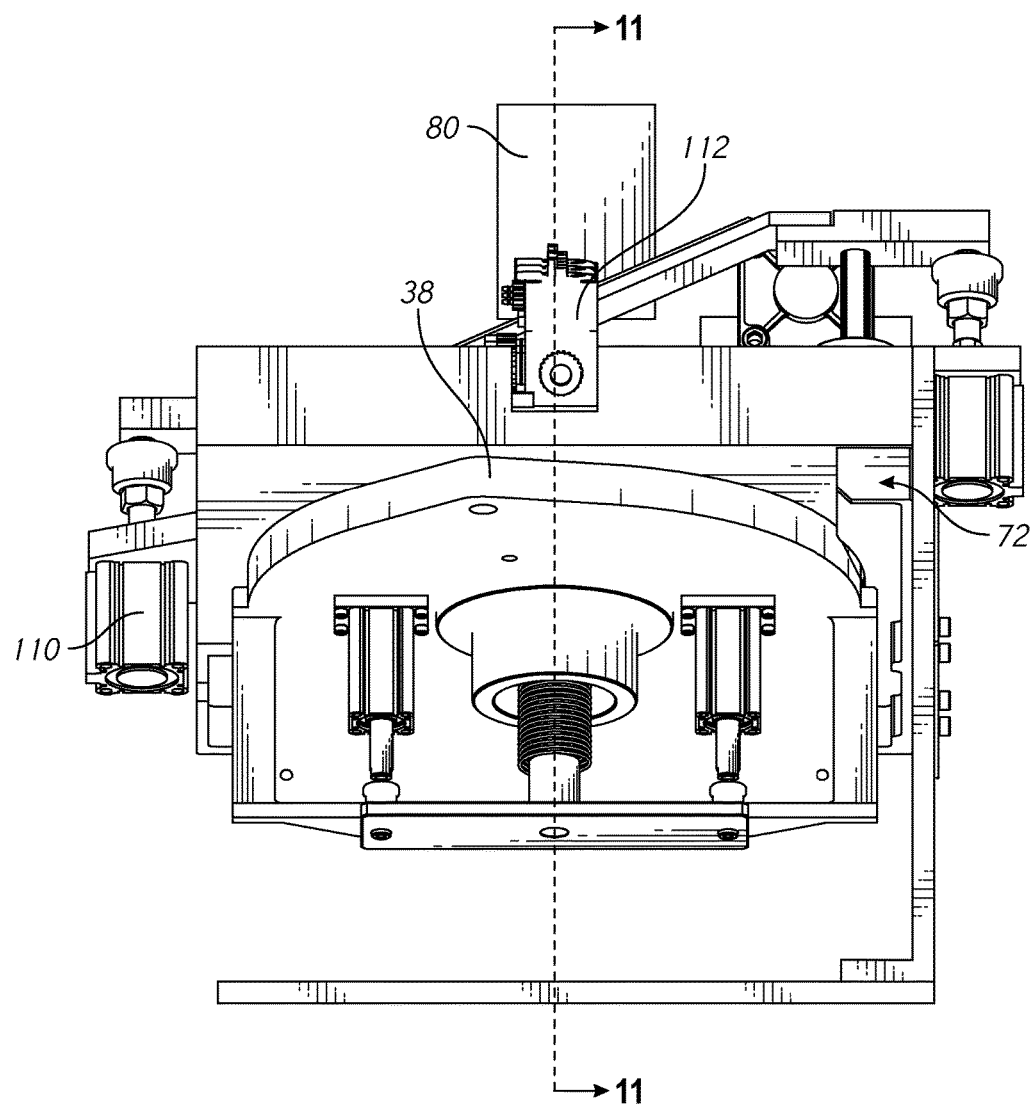
FIG. 10 is a front view of the tool as shown in FIG. 9.

Referring to FIGS. 7 and 8, the pivot actuator 102 is extended outwardly pushing the roller 57 against the lever 55 which pivots the entire platform assembly 28 about the hinge 100 into the parallel position shown in FIG. 7. The lift actuators 110 are then retracted pulling the chuck 38 and the chuck plate 52 up into the process position shown in FIGS. 9 and 10. The linear movement DD in FIG. 7 between the parallel position and the process position is generally 1-4 cm. As the chuck plate 52 moves up into engagement with the chamber plate 24, the platform seal 58 is compressed between them, sealing the chamber 50. The seal 58 is compressed evenly without scraping or scrubbing as the sealing movement is purely linear with no rotation motion.

The valve block 112 is controlled (via a tool or system electronic controller) to connect the chamber 50 to a vacuum source. Air in the chamber and in the features of the wafer is drawn out.

The tank 80 is also connected to the vacuum source. Water is sprayed out of the nozzle 90. Dissolved gasses are drawn off and degasified water collects in the tank 80. The valve 66 opens allowing the chamber 50 to fill with degasified water. The water flows into the chamber 50 via gravity until the wafer 40 is covered. Gravity flow may be used because the tank 80 is above the chamber 50, and the pressure of the tank 80 and the chamber 50 is equalized via the equalization line 86 and operation of the valve block 112. Gravity flow decreases the turbulence of the water entering the chamber. The chamber 50 is then vented to ambient pressure and the water drained out of the chamber. The equalization line may be closed to maintain vacuum in the degasification tank 80.

The lift actuators 110 are reversed pulling the chuck out of the chamber and back to the parallel position shown in FIG. 7. The pivot actuator 102 is reversed rotating the platform assembly back into the handoff position shown in FIGS. 1-4. The robot removes the chuck holding the pre-wetted wafer. The pre-wetted wafer, still in the chuck, may be moved into a plating chamber 154 via the robot 152 shown in FIG. 12.

Turbulent water flow in the chamber may result in droplets that splash onto the wafer surface before the bulk fluid wets the wafer surface. This can cause defects. Consequently, the water entering the vacuum pre-wet chamber preferably covers the wafer in a smooth quiescent manner via gravity flow and valve control. Dissolved oxygen in non-degassed or insufficiently degassed water can nucleate and cause air bubbles and splashing. The degassing tank 80 is used to effectively degas the water and avoid these drawbacks. The degassing tank is positioned vertically above the chamber 50 to allow for quiescent flow into the chamber 50. The degassing tank may operate continuously so that degassed water is continuously available.

In some applications the spray nozzle 90 may be omitted with the water degasified via exposing the free surface area of the water to vacuum in the tank 80. However, spraying is generally more effective as it exposes the surface area of the individual droplets to vacuum before they enter the bulk fluid. The tank 80 may be evacuated to pressure different from the process chamber 50.

The volume of the chamber 50 is minimized to e.g., 0.5 to 1.5 liters for a 300 mm diameter wafer, so that the time required to fill and drain the chamber are minimized. The wafer 50 is supported on a wafer seal 130 in the chuck. The back side of the wafer and the chuck are exposed to vacuum to avoid a pressure differential which could unduly stress and damage the wafer. A wafer equalization through hole in the chamber plate, above the maximum water level of the chamber 50, maintains equal pressure on both sides of the wafer. A wafer equalization line from the valve block 112 connects to the through hole.

The chamber is inclined at a fixed angle AA in FIG. 4 to allow for easy filling and draining across the wafer surface. Water enters and exits via the inlet 64 and drain 65 which are at the lowest point in the chamber to allow the fluid to smoothly sweep up and drain down the wafer surface. The vacuum valve block 112 is located at the highest point of the chamber to minimize any water that may be overfilled and sucked into the vacuum system. To help keep the chamber volume to a minimum, the valves that control the flow of fluid or gas into and out of the chamber may be directly mounted to the chamber plate 24, eliminating any fittings or lines between the valves and the process chamber. The chamber plate 24 may be fixed, with all of the fluid connections attached to it.

During a pre-wet process, the chamber 50 may be operated at room temperature and at a pressure just above the boiling point of water, generally about 12-50 torr. After the wafer is covered with water, the vacuum may be maintained for up to 30, 60 or 120 seconds, or longer, to dissolve trapped gasses into the deionized and degassified water. In some applications, depending on the feature materials and characteristics, vigorous boiling may be used to agitate water in the features of the wafer and displace air from the features.

Pressure cycling may also be used, where with the wafer covered in water within the chamber 50, the pressure in the chamber is rapidly cycled. This may be performed by reducing the pressure to minimum, usually at a nominal pressure just sufficient to avoid boiling. Water is introduced into the chamber to entirely cover the wafer. The chamber is then rapidly vented to ambient pressure. The chamber is then rapidly returned to the vacuum conditions, and the chamber than again rapidly vented. This pressure cycling may be repeated 2, 3, 4 or 5 times. The water is then drained and the chuck removed from the apparatus 20.

As used here, connected means functionally linked with, and not necessary adjoining and/or mechanically attached to. Relative to liquid holding or handling elements, connected means plumbed to, i.e., with a hose, line or tube directly or indirectly carrying liquid between elements. Horizontal means the line or plane formed by liquid in a vessel. Above and below have their conventional meanings as relative to the direction of gravity.

Thus, novel methods and apparatus have been shown and described. Various changes and substitutions may of course be made without departing from the spirit and scope of the invention. The invention, therefore, should not be limited except by the following claims and their equivalents.

The invention claimed is:

1. Processing apparatus, comprising:
a base;
a chamber plate at a fixed acute angle to the base, with the chamber plate including a down-facing substrate processing chamber;
a chuck plate on a platform below the chamber plate, with the chuck plate pivotal from an open position wherein the platform is at an acute angle to the chamber plate, to a closed position wherein the platform is parallel to the chamber plate;
a chuck holder on the platform movable from a load/unload position wherein a wafer chuck may be loaded onto or removed from the platform, to a hold position wherein the chuck is secured onto the platform.

2. The apparatus of claim 1 with a first side of the down-facing substrate processing chamber vertically above a second side of the down-facing substrate processing chamber, and with a vacuum port at the first side of the down-facing substrate processing chamber connectable to a vacuum source, and a liquid inlet and a liquid drain at the second side of the down-facing substrate processing chamber.

3. The apparatus of claim 1 further including a liquid de-gassifier supported on the chamber plate and connected to the liquid inlet, with the de-gassifier including a tank, a tank vacuum source connected to the tank, a spray nozzle in the tank connected to a liquid source, and pressure equalization line connecting the tank to the down-facing substrate processing chamber.

4. The apparatus of claim 3 with the tank vertically above the processing chamber.

5. The apparatus of claim 1 further including at least one actuator for moving the platform linearly into sealing engagement with the chamber plate.

6. The apparatus of claim 1 with the down-facing substrate processing chamber having an upper surface oriented at an angle of 10-30 degrees to horizontal.

7. The apparatus of claim 1 with the down-facing substrate processing chamber having a volume of 0.5 to 2.5 liters.

8. The apparatus of claim 1 further including a vacuum seal on the platform sealing against the chamber plate, and a chuck seal sealing against the chuck, when the platform is sealed against the chamber plate.

9. The apparatus of claim 1 with the chuck holder including a chuck fitting on a shaft, a spring urging the chuck fitting into the hold position, and a chuck actuator operable to move the chuck fitting into the load/unload position, against the force of the spring.

10. A vacuum pre-wet apparatus, comprising
a base;
a chamber plate having a substrate processing chamber oriented at a fixed angle relative to the base;
a chuck plate on a platform assembly;
a pivot actuator connected to the platform assembly for pivoting the platform assembly from a first position where the chuck plate is at an acute angle to the processing chamber, to a second position wherein the chuck plate is parallel to the processing chamber; and
at least one lift actuator attached to the platform assembly and to the chamber plate, for moving the chuck plate linearly into sealing engagement with the chamber plate.

11. The apparatus of claim 10 with the pivot actuator supported on the platform assembly.

12. The processing apparatus of claim 6 with the platform horizontal when in the load/unload position.

13. A vacuum pre-wet apparatus for pre-wetting a substrate in a chuck, comprising
a chamber plate having a down-facing processing chamber;
a chuck plate on a platform assembly below the chamber plate, with the chuck plate adapted to receive a chuck holding a substrate;
a pivot actuator connected to the platform assembly for pivoting the platform assembly from a first position where the chuck plate is at an angle to the chamber plate, to a second position wherein the chuck plate is parallel to the chamber plate; and
at least one lift actuator attached to the platform assembly for moving the chuck plate linearly into and out of sealing engagement with the chamber plate while the platform assembly is in the second position.

14. The apparatus of claim 13 with the pivot actuator supported on the platform assembly.

15. The apparatus of claim 13 wherein the pivot actuator is a linear actuator and the chuck plate is attached to the chamber plate via a hinge.

16. The apparatus of claim 13 with the at least one lift actuator also attached to the chamber plate.

\* \* \* \* \*